United States Patent
Dutta et al.

(10) Patent No.: US 7,360,182 B2
(45) Date of Patent: Apr. 15, 2008

(54) METHOD AND SYSTEM FOR REDUCING DELAY NOISE IN AN INTEGRATED CIRCUIT

(75) Inventors: Arijit Dutta, West Bengal (IN); Bhuwan K Agrawal, Noida (IN); Atul Dogra, New Delhi (IN)

(73) Assignee: Freescale Semiconductor, Inc., Austin, TX (US)

( * ) Notice: Subject to any disclaimer, the term of this patent is extended or adjusted under 35 U.S.C. 154(b) by 129 days.

(21) Appl. No.: 11/476,386

(22) Filed: Jun. 28, 2006

(65) Prior Publication Data

US 2006/0294478 A1    Dec. 28, 2006

(30) Foreign Application Priority Data

Jun. 28, 2005    (IN)    .................. 1669/DEL/2005

(51) Int. Cl.
*G06F 17/50*    (2006.01)

(52) U.S. Cl. ................. 716/2; 716/1; 716/3; 716/5

(58) Field of Classification Search ............ 716/1, 716/2, 3, 5
See application file for complete search history.

(56) References Cited

U.S. PATENT DOCUMENTS

| 6,467,069 | B2 | 10/2002 | Mehrotra et al. |
| 6,480,998 | B1 | 11/2002 | Mukherjee et al. |
| 6,601,222 | B1 | 7/2003 | Mehrotra et al. |
| 6,732,346 | B2 | 5/2004 | Horne et al. |
| 2004/0044979 | A1 | 3/2004 | Aji et al. |
| 2004/0103386 | A1 | 5/2004 | Becer et al. |

*Primary Examiner*—Sun James Lin
(74) *Attorney, Agent, or Firm*—Charles Bergere

(57) ABSTRACT

A method and a system for reducing delay noise in an integrated circuit (IC) includes generating delay information for each net, and each device of the IC. Each net has a ground capacitance, a coupling capacitance, and a resistance. An effective capacitance is computed for each net. The effective capacitance is divided by sum of the ground capacitance and the coupling capacitance to compute a scale factor. The effective capacitance is then scaled by the scale factor to determine a delay noise induced load. Finally, the timing paths are optimized incrementally by using the delay noise induced load, the resistance, and the delay information.

18 Claims, 3 Drawing Sheets

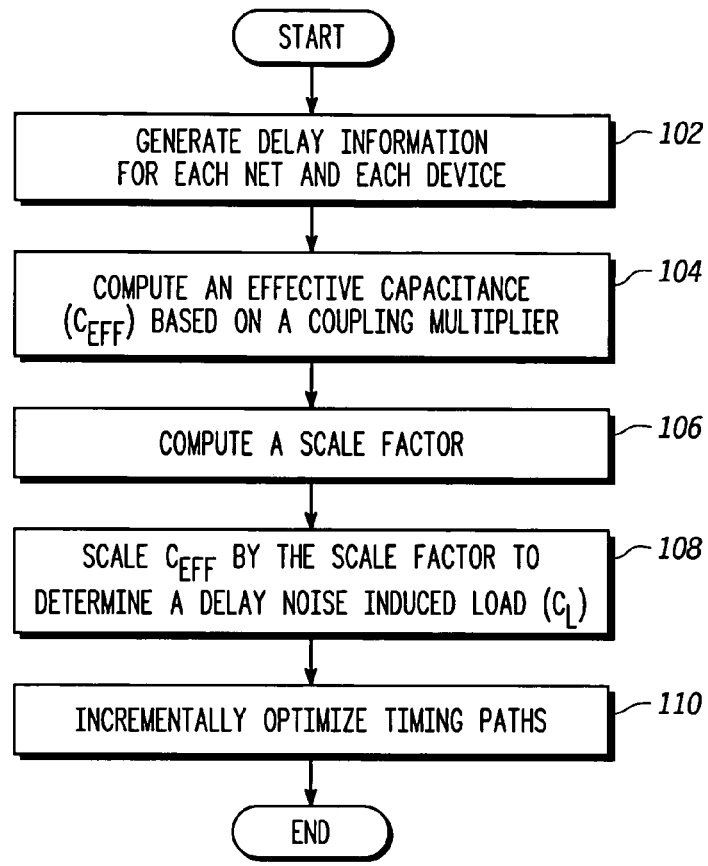
FIG. 1
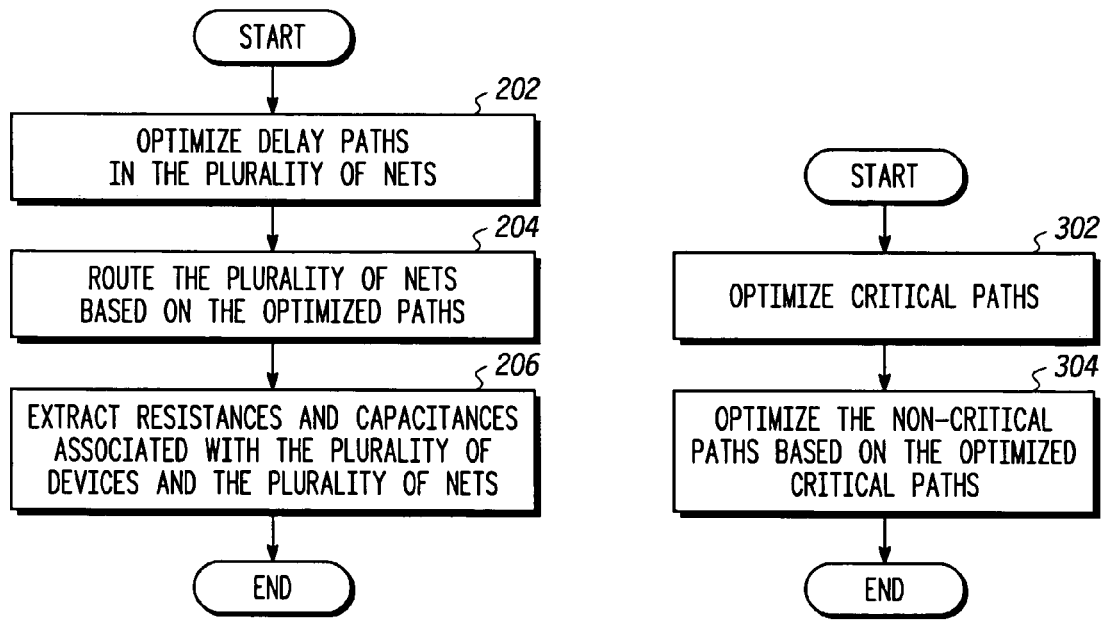
FIG. 2
FIG. 3

METHOD AND SYSTEM FOR REDUCING DELAY NOISE IN AN INTEGRATED CIRCUIT

BACKGROUND OF THE INVENTION

The present invention relates generally to integrated circuit design tools and, in particular, to noise optimization in an integrated circuit.

Signal integrity (SI) is a critical issue for Deep Sub Micron (DSM) Integrated Circuits (ICs). Devices in an IC are connected through interconnects. However, as ICs are scaled down in size, there is a corresponding increase in interconnect density, which can introduce unwanted components of capacitance, resistance and inductance in one or more nets of an IC. These unwanted components result in crosstalk noise, which includes functional noise and delay noise. The nets on which crosstalk noise is injected by one or more neighboring nets are called victim nets and the nets that inject the noise are called aggressor nets. Functional noise occurs when a victim net does not switch at the time of switching of the aggressor nets. However, when the victim net also switches at the time of switching of the aggressor nets, the victim net's delay can either increase or decrease depending on the aggressor nets' and the victim's switching directions, which results in delay noise that can cause setup or hold time failures. Therefore, delay noise needs to be minimized to achieve targeted performance metrics.

In conventional methods for reducing delay noise, a static timing analysis is carried out in an IC design flow after routing and extraction have been performed. The static timing analysis provides violations caused by the delay noise. These violations are then fixed by repeating the previous design flow steps such as routing or placement of devices. The process is repeated until all the violations are fixed, which increases the design time considerably. Further, the method depends on complex and unpredictable repair flows. Also, it does not prevent the occurrence of delay noise and is not cost-effective.

Accordingly, it is an object of the present invention to provide a method and system for reducing delay noise in an IC.

BRIEF DESCRIPTION OF THE DRAWINGS

The following detailed description of preferred embodiments of the invention will be better understood when read in conjunction with the appended drawings. The present invention is illustrated by way of example and not limited by the accompanying figures, in which like references indicate similar elements.

FIG. 1 is a flowchart depicting a method for reducing delay noise in an integrated circuit in accordance with an embodiment of the present invention;

FIG. 2 is a flowchart depicting a method for incrementally optimizing the timing paths in accordance with an embodiment of the present invention;

FIG. 3 is a flowchart depicting a method for optimizing the delay paths in the nets in accordance with an embodiment of the present invention;

DETAILED DESCRIPTION OF THE INVENTION

Figure 4:
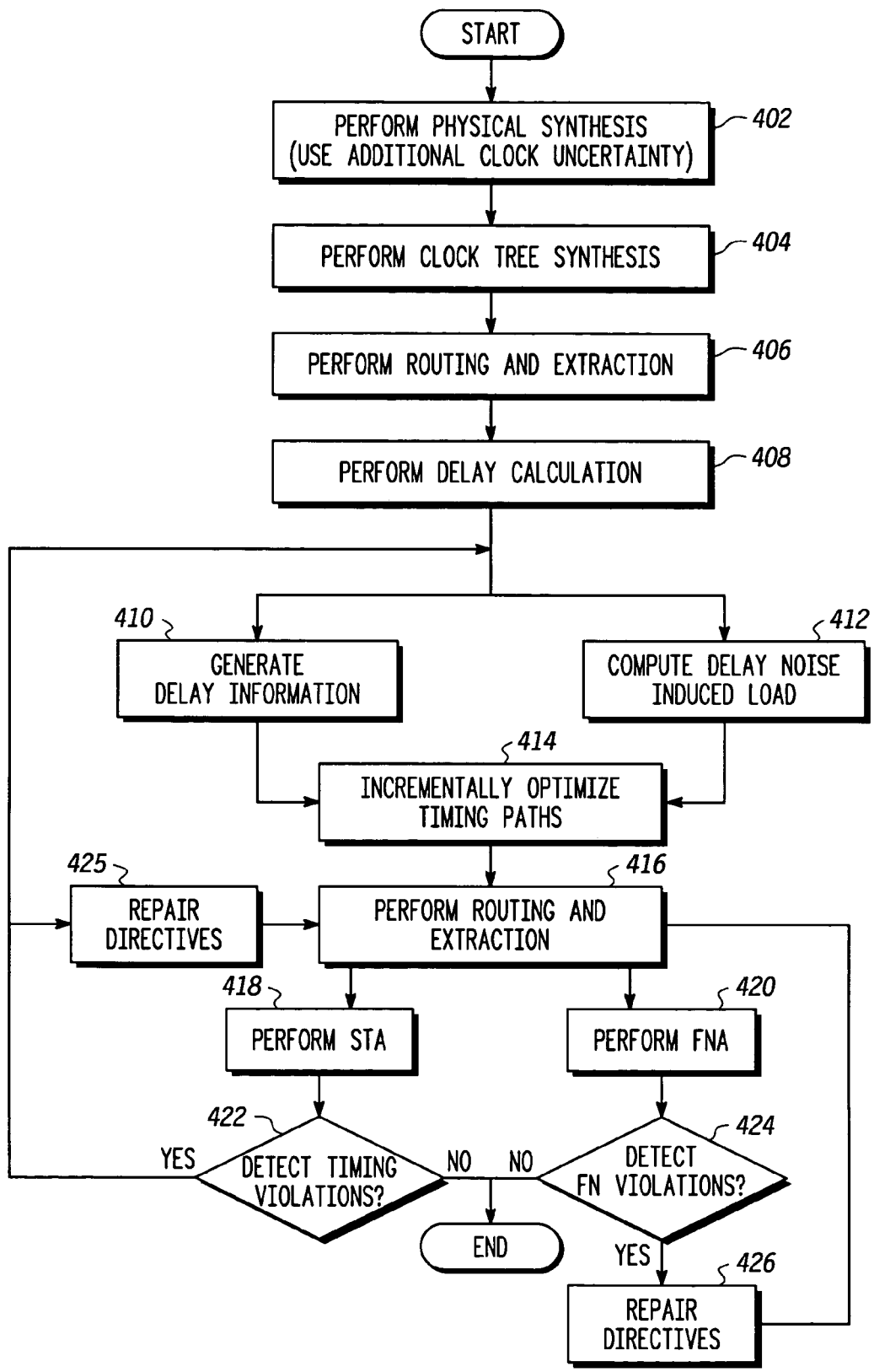
FIG. 4 is a flowchart illustrating an exemplary IC design flow in accordance with an embodiment of the present invention.

The detailed description in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention. While the term optimize and derivations thereof are used in the specification, the term is not meant to mean the most optimal or best, but rather denotes improvement or iterative improvement.

The present invention provides a method for reducing delay noise in an integrated circuit (IC). The IC includes a plurality of devices and a plurality of nets. Each net has a ground capacitance, a coupling capacitance, and a resistance. The method includes generating delay information for each net and each device. An effective capacitance is computed for each net based on a coupling multiplier. The coupling multiplier is based on the ground capacitance and the coupling capacitance. A scale factor is computed by dividing the effective capacitance by sum of the ground capacitance and the coupling capacitance. The effective capacitance is then scaled by the scale factor to determine a delay noise induced load. The timing paths are optimized incrementally using the delay noise induced load, the resistance, and the delay information.

In another embodiment of the present invention, a system for reducing delay noise in an integrated circuit (IC) is provided. The IC includes a plurality of devices and a plurality of nets. Each net has a ground capacitance, a coupling capacitance, and a resistance. The system includes means for generating delay information, means for computing an effective capacitance for each net, means for computing a scale factor, means for scaling the effective capacitance by the scale factor, and means for incrementally optimizing the timing paths. The delay information is generated for each net and each device. The effective capacitance is computed based on a coupling multiplier, which is based on the ground capacitance and the coupling capacitance. The scale factor is computed by dividing the total capacitance by sum of the ground capacitance and the coupling capacitance. The effective capacitance is scaled by the scale factor to determine a delay noise induced load. The timing paths are incrementally optimized using the delay noise induced load, the resistance, and the delay information.

The present invention provides a unique delay noise induced load for each net in an IC. The IC includes several nets and devices. Each net of the IC has a ground capacitance ($C_g$), a coupling capacitance ($C_c$), and a resistance. The coupling capacitance $C_c$ arises on account of coupling between two neighboring nets. The delay noise in each net of the IC is affected by the neighboring nets. The delay noise induced load accurately accounts for the delay noise induced in timing paths of each net due to the neighboring nets. Therefore, the delay noise induced timing violations in late stages of IC design flow are reduced, which reduces the design time. Further, the present invention can be easily implemented with only minor modifications to currently available electronic design automation (EDA) solutions. Therefore, organizations can continue with their EDA solutions, and save effort, time and money required for migrating to new EDA tools.

FIG. 1 is a flowchart depicting a method for reducing delay noise in an integrated circuit in accordance with an embodiment of the present invention. At step 102, delay information is generated for each net and each device. The delay information includes the delays in all the timing paths of the IC. Then, a coupling multiplier (K) is computed. The value of the coupling multiplier (K) can vary between −1 and 3, however, for maximizing path delays, the value of K varies between 1 and 3. It should be noted that the value of K for noisy nets varies in a finite range. In an embodiment of the present invention, K is computed heuristically. The value of K can be a single value or it can be chosen from the lookup table. Results for 90 nm technology are shown in Table 1 below.

TABLE 1

| Cc/(Cc + Cg) in % | Coupling Multiplier (K) |
| --- | --- |
| 0.07 | 2.5 |
| 0.2 | 2.62 |
| 0.33 | 2.62 |
| 0.43 | 2.66 |
| 0.5 | 2.68 |
| 0.6 | 2.77 |
| 0.67 | 2.87 |
| 0.73 | 2.87 |
| 0.8 | 2.94 |
| 0.83 | 2.88 |

The value of K depends on the process technology used to fabricate the IC. At step 104, an effective capacitance ($C_{eff}$) is computed using the value of K. In an embodiment of the present invention, $C_{eff}$ is given by:

$$C_{eff} = C_g + K \times C_c \quad (1)$$

At step 106, a scale factor ($\alpha$) is computed by dividing $C_{eff}$ by the sum of $C_g$ and $C_c$, where $\alpha$ is given by:

$$\alpha = \frac{C_g + KC_c}{C_g + C_c} \quad (2)$$

At step 108, $C_{eff}$ is scaled by $\alpha$ to determine a delay noise induced load ($C_L$), $$C_L = \alpha C_{eff} \quad (3)$$

At step 110, the timing paths are incrementally optimized using $C_L$, the resistance and the delay information, as described in detail below.

FIG. 2 is a flowchart depicting a method for incrementally optimizing the timing paths in accordance with an embodiment of the present invention. For optimizing the timing paths, the delay information is generated by determining delays in the various timing paths of the IC. The delay information indicates timing violations in the various timing paths. Further, the effect of circuit timing constraints such as clock frequency, clock duty cycle, and worst-case delay in a timing path are also considered. At step 202, the timing paths with delays, or delay paths, in the nets are optimized.

The delay path optimization is herein explained, in conjunction with FIG. 3. FIG. 3 is a flowchart depicting a method for optimizing the delay paths in the nets, in accordance with an embodiment of the present invention. Some of the delay paths are critical for the performance of the IC, while some are non-critical. The critical paths are prone to delay noise due to absence of timing slack margins in the delays associated with the critical paths. At step 302, the critical paths are optimized. However, critical path optimization may affect the delays in the neighboring non-critical paths. That is, critical path optimization may induce additional noise in the neighboring non-critical paths. Hence, at step 304, such non-critical paths are also optimized. During the delay path optimization, timing violations are fixed by inserting buffers in interconnects present in the delay paths, modifying the placement of the devices associated with the delay paths, or upsizing the devices associated with the delay paths.

Once the delay paths are optimized, routing is performed in the nets. Referring back to FIG. 2, the nets are routed based on the optimized delay paths, at step 204. At step 206, the resistances and capacitances associated with the routed nets and devices are extracted. The extracted values are then used in the rest of the IC design flow.

FIG. 4 is a flowchart illustrating an exemplary IC design flow based on the method described above. At step 402, the devices are placed using physical synthesis. At the onset of the physical synthesis, an uncertainty is added to time period of a clock that synchronizes the devices. This uncertainty reduces the clock time period. The value of the uncertainty can vary within a range, which is determined by the process technology of the devices, and the maximum clock frequency. The lower limit of this range depends on the process technology, while the upper limit depends on the maximum clock frequency. In an exemplary embodiment of the present invention, the value of uncertainty for a 90 nm complementary metal oxide semiconductor (CMOS) technology is about 200 picoseconds.

At step 404, a clock tree synthesis is performed. After the clock tree synthesis, the placed devices are routed at step 406. The resistances and capacitances associated with the devices and nets are then extracted. At step 408, a delay calculation is performed. The delay calculation is used to generate delay information, at step 410. At step 412, $C_L$ is computed, as described earlier. At step 414, the timing paths are incrementally optimized by performing a timing driven design optimization to reduce the delay noise. In an embodiment of the present invention, a physical synthesis tool is used to perform the incremental optimization. A physical compiler, such as available from Synopsys, Inc. of Mountain View, Calif., USA, can be used for incremental optimization. Some other tools like First Encounter from Cadence Design Systems, Inc. of San Jose, Calif., USA can also be used for incremental optimization. For this purpose, the delay information, and the value of $C_L$ are provided to the physical synthesis tool.

At step 416, routing and extraction are performed for the timing paths. A static timing analysis (STA) is then performed to determine the timing violations that may occur in these paths, due to delay noise. The STA is performed, at step 418, using the extracted values. Simultaneously, a functional noise analysis (FNA) is performed at step 420. The FNA determines the presence of functional noise in the nets. At step 422, the IC design is tested for occurrence of the timing violations. In case a timing violation occurs, the delay calculation is repeated to generate new delay information. Also, a new $C_L$ is computed. These newly computed values then are used to optimize the timing paths. As shown in FIG. 4, this process is repeated until there are no further timing violations. In certain cases, depending on placement and routing topologies, SI-driven routing involving steps like net spacing, layer switching and shielding are more effective in solving delay noise issues. In such instances, routing repair directives at step 425 are passed on to the router, and the timing optimization loop is bypassed. At step 424, the IC design is tested for the functional noise violations. If any functional noise violations are found, they are repaired using repair directives, at step 426. Driver sizing, buffer addition and routing directives like spacing and shielding are some of the more commonly used repair directives. Routing and extraction then are performed again at step 416, to account for the repair. As shown in FIG. 4, this process is repeated until there are no further functional noise violations. In this way, the timing paths are optimized in increments.

Figure 5:
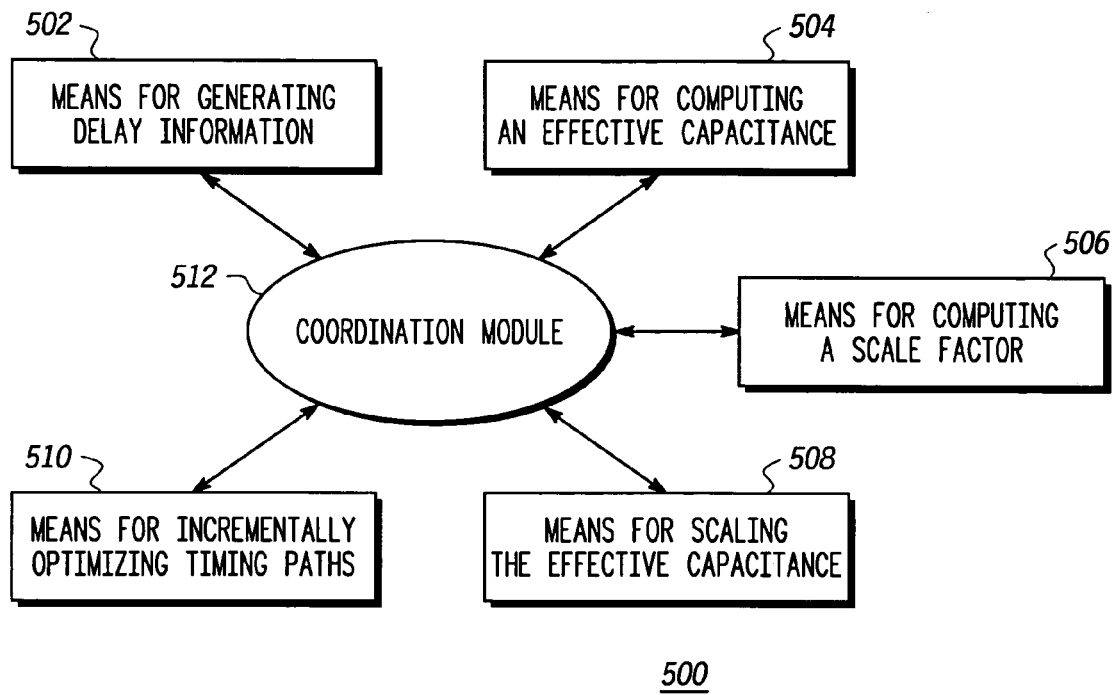
FIG. 5 shows a system for reducing delay noise in an integrated circuit, in accordance with an embodiment of the invention.

FIG. 5 shows a software system 500 for reducing delay noise in an integrated circuit in accordance with an embodiment of the invention. The system 500 includes means for generating delay information 502, means for computing $C_{eff}$ 504, means for computing α 506, means for scaling $C_{eff}$ 508, and means for incrementally optimizing the timing paths 510. As will be understand by those of skill in the art, such means comprise a programmed computer as is commonly used for design synthesis and verification. The means for generating the delay information 502 generates the delay information for each net and each device of the IC. The means for computing $C_{eff}$ 504 computes $C_{eff}$ for each net based on the value of K. The means for computing α 506 computes α by dividing $C_{eff}$ by the sum of $C_g$ and $C_c$. The means for scaling $C_{eff}$ 508 scales $C_{eff}$ by α to determine $C_L$. The means for incrementally optimizing timing paths 510 optimizes the delay noise using $C_L$, the resistance, and the delay information. As shown in FIG. 5, a coordination module 512 coordinates between the means mentioned above.

The system, as described in the present invention or any of its components, may be embodied in the form of a computer system of the type commonly used to perform design synthesis, verification and analysis. A typical example of a computer system includes a plurality of workstations networked to a general-purpose computer. The workstations may comprise computers with processors that run either UNIX or Windows, or any other operating system. The computer system executes a set of instructions that are stored in one or more storage elements, to process input data. The storage elements may also hold data or other information as desired. A storage element may be an information source or physical memory element present in the processing machine.

The set of instructions may include various commands that instruct the processing machine to perform specific tasks such as the steps that constitute the method of the present invention. The set of instructions may be in the form of a software program. The software may be in various forms, such as system software or application software. Further, the software may be in the form of a collection of separate programs, a program module with a larger program, or a portion of a program module. The software can be embodied in the form of hardware description languages such as VHDL. The processing of input data by the processing machine may be in response to user commands to results of previous processing, or in response to a request made by another processing machine.

While various embodiments of the invention have been illustrated and described, it will be clear that the invention is not limited to these embodiments only. Numerous modifications, changes, variations, substitutions, and equivalents will be apparent to those skilled in the art, without departing from the spirit and scope of the invention, as described in the claims.

The invention claim is:

1. A method for reducing delay noise in an integrated circuit, the integrated circuit comprising a plurality of devices and a plurality of nets, wherein each net having a ground capacitance, a coupling capacitance, and a resistance, the method comprising:
   generating delay information for each net and each device;
   computing an effective capacitance for each net is determined based on a coupling multiplier, wherein the coupling multiplier is based on the ground capacitance and the coupling capacitance;
   computing a scale factor for each net, wherein the scale factor is computed by dividing the effective capacitance by a sum of the ground capacitance and the coupling capacitance;
   scaling the effective capacitance by the scale factor to determine a delay noise induced load for each net; and
   incrementally optimizing timing paths using the delay noise induced load, the resistance, and the delay information.

2. The method for reducing delay noise of claim 1, wherein the delay information is generated by performing a delay calculation on the integrated circuit.

3. The method for reducing delay noise of claim 1, wherein the incrementally optimizing timing paths comprises:
   optithizing delay paths in the plurality of nets;
   routing the plurality of nets based on the optimized delay paths; and
   extracting resistances and capacitances associated with the plurality of devices and the plurality of nets based on the optimized delay paths.

4. The method for reducing delay noise of claim 3, wherein the optimizing delay paths in the plurality of nets comprises optimizing critical paths.

5. The method for reducing delay noise of claim 3, wherein the optimizing delay paths in the plurality of nets comprises:
   optimizing critical paths; and
   optimizing non-critical paths based on the optimized critical paths.

6. The method for reducing delay noise of claim 3, wherein the optimizing delay paths in the plurality of nets comprises inserting buffers in the delay paths.

7. The method for reducing delay noise of claim 3, wherein the optimizing delay paths in the plurality of nets comprises modifying placement of devices associated with the delay paths.

8. The method for reducing delay noise of claim 3, wherein the optimizing delay paths in the plurality of nets comprises upsizing devices associated with the delay paths.

9. The method for reducing delay noise of claim 1, wherein the incrementally optimizing timing paths comprises providing the delay noise induced load, and the delay information for performing a timing driven design optimization.

10. The method for reducing delay noise of claim 1, further comprising inducing an uncertainty into a time period of a clock that clocks the plurality of devices.

11. The method for reducing delay noise of claim 1, wherein the coupling multiplier also is determined based on a process technology of the integrated circuit.

12. The method for reducing delay noise of claim 11, wherein the incrementally optimizing timing paths step also uses circuit timing constraints.

13. A system for reducing delay noise in an integrated circuit, the integrated circuit comprising a plurality of devices and a plurality of nets, wherein each net having a ground capacitance, a coupling capacitance, and a resistance, the system comprising:
- means for generating delay information for each net and each device;
- means for computing an effective capacitance for each net based on a coupling multiplier, wherein the coupling multiplier is determined based on the ground capacitance and, the coupling capacitance;
- means for computing a scale factor for each net, wherein the scale factor is computed by dividing the effective capacitance by a sum of the ground capacitance and the coupling capacitance;
- means for scaling the effective capacitance by the scale factor to determine a delay noise induced load for each net; and
- means for incrementally optimizing timing paths using the delay noise induced load, the resistance, and the delay information.

14. The system for reducing delay noise of claim 13, wherein the coupling multiplier also is determined based on a process technology of the integrated circuit.

15. The system for reducing delay noise of claim 14, wherein the means for incrementally optimizing timing paths also uses circuit timing constraints.

16. A computer program product for reducing delay noise in an integrated circuit, the integrated circuit comprising a plurality of devices and a plurality of nets, wherein each net having a ground capacitance, a coupling capacitance, and a resistance, the computer program product comprising a computer readable medium comprising:
- program instructions for generating delay information for each net and each device;
- program instructions for computing an effective capacitance for each net based on a coupling multiplier, wherein the coupling multiplier is determined based on the ground capacitance and the coupling capacitance;
- program instructions for computing a scale factor for each net, wherein the scale factor is computed by dividing the effective capacitance by a sum of the ground capacitance and the coupling capacitance;
- program instructions for scaling the effective capacitance by the scale factor to determine a delay noise induced load for each net; and
- program instructions for incrementally optimizing timing paths using the delay noise induced load, the resistance, and the delay information.

17. The computer program product for reducing delay noise of claim 16, wherein the couplings multiplier also is determined based on a process technology of the integrated circuit.

18. The computer program product for reducing delay noise of claim 17, wherein the program instructions for incrementally optimizing timing paths also uses circuit timing constraints.

* * * * *